United States Patent
Subburaj et al.

(10) Patent No.: US 8,248,118 B2
(45) Date of Patent: Aug. 21, 2012

(54) HIGH-SPEED FREQUENCY DIVIDER AND A PHASE LOCKED LOOP THAT USES THE HIGH-SPEED FREQUENCY DIVIDER

(75) Inventors: Karthik Subburaj, Bangalore (IN); Dhanya K, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 12/852,520

(22) Filed: Aug. 9, 2010

(65) Prior Publication Data

US 2012/0032715 A1    Feb. 9, 2012

(51) Int. Cl.
*H03K 21/00* (2006.01)
*H03K 23/00* (2006.01)
*H03K 25/00* (2006.01)

(52) U.S. Cl. ........ 327/115; 327/117; 327/147; 327/156; 327/161; 375/376

(58) Field of Classification Search .................. 327/115, 327/117, 147, 156, 161; 375/376
See application file for complete search history.

(56) References Cited

U.S. PATENT DOCUMENTS

| 7,289,592 | B2 * | 10/2007 | Lee | ................................ 377/47 |
| 2008/0042699 | A1 * | 2/2008 | Narathong et al. | ........... 327/117 |
| 2008/0043893 | A1 | 2/2008 | Nagaraj et al. | |

* cited by examiner

*Primary Examiner* — John Poos
(74) *Attorney, Agent, or Firm* — Ronald O. Neerings; Wade James Brady, III; Frederick J. Telecky, Jr.

(57) ABSTRACT

A frequency divider includes a least significant (LS) stage, multiple cascaded divider stages, and an output stage. The LS stage receives an input signal, a program bit and a first mode signal, and generates a first frequency-divided signal and an output mode signal. Each of the plurality of divider stages divides the frequency of an output of an immediately previous stage by a value specified by a corresponding program bit and a corresponding mode signal. A first divider stage in the plurality of divider stages is coupled to receive the first frequency-divided signal and to generate the first mode signal. The output stage receives the output mode signal and a control signal, and generates an output signal by dividing a frequency of the output mode signal by two if the control signal is at one logic level. The output stage forwards the output mode signal without division otherwise.

10 Claims, 12 Drawing Sheets

HIGH-SPEED FREQUENCY DIVIDER AND A PHASE LOCKED LOOP THAT USES THE HIGH-SPEED FREQUENCY DIVIDER

BACKGROUND

1. Technical Field

Embodiments of the present disclosure relate generally to electronic circuits, and more specifically to a high-speed frequency divider and a phase locked loop that uses the high-speed frequency divider.

2. Related Art

A frequency divider is a circuit that divides the frequency of an input signal, and provides an output signal that has a lower frequency than the input signal. The division factor by which a frequency divider is to divide the frequency of an input signal may be fixed or (statically or dynamically) programmable via corresponding program signals. The range of frequencies of the input and output signals of a frequency divider typically determines the 'speed' of operation of the frequency divider. In general, higher the maximum frequency of input and/or output signals of a frequency divider, the higher the 'speed' of the frequency divider. Thus, for example, a frequency divider capable of operating with input and/or output signals in the Giga Hertz range may be viewed as a high-speed frequency divider.

Phase locked loop (PLL) circuits are often used to generate output signals synchronous with an input reference signal. The output signal is generally designed to have a frequency equaling a desired multiple of the input reference signal. In addition, the output signal is ideally in phase-lock with the input reference signal. The signals (e.g., clock signals) generated by PLLs may be provided to various external circuits (e.g., processors), as is well known in the relevant arts.

Several embodiments of the present disclosure are directed to high-speed frequency dividers and a phase locked loop that uses such high-speed frequency dividers.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A frequency divider includes a least significant (LS) stage, a plurality of cascaded divider stages, and an output stage. The LS stage is coupled to receive an input signal, a first program bit and a first mode signal, and generates a first frequency-divided signal and an output mode signal. The first mode signal in combination with the first program bit specifies a division mode to be used by the LS stage. Each of the plurality of divider stages divides the frequency of an output of an immediately previous stage by a value specified by a corresponding program bit and a corresponding mode signal. A first divider stage in the plurality of divider stages is coupled to receive the first frequency-divided signal and to generate the first mode signal. The output stage is coupled to receive the output mode signal and a control signal, and generates an output signal by dividing a frequency of the output mode signal by two if the control signal is at one logic level. The output divider stage forwards the output mode signal without division otherwise.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

The drawing in which an element first appears is indicated by the leftmost digit(s) in the corresponding reference number.

DETAILED DESCRIPTION

Various embodiments are described below with several examples for illustration.

1. Example Environment

Figure 1:
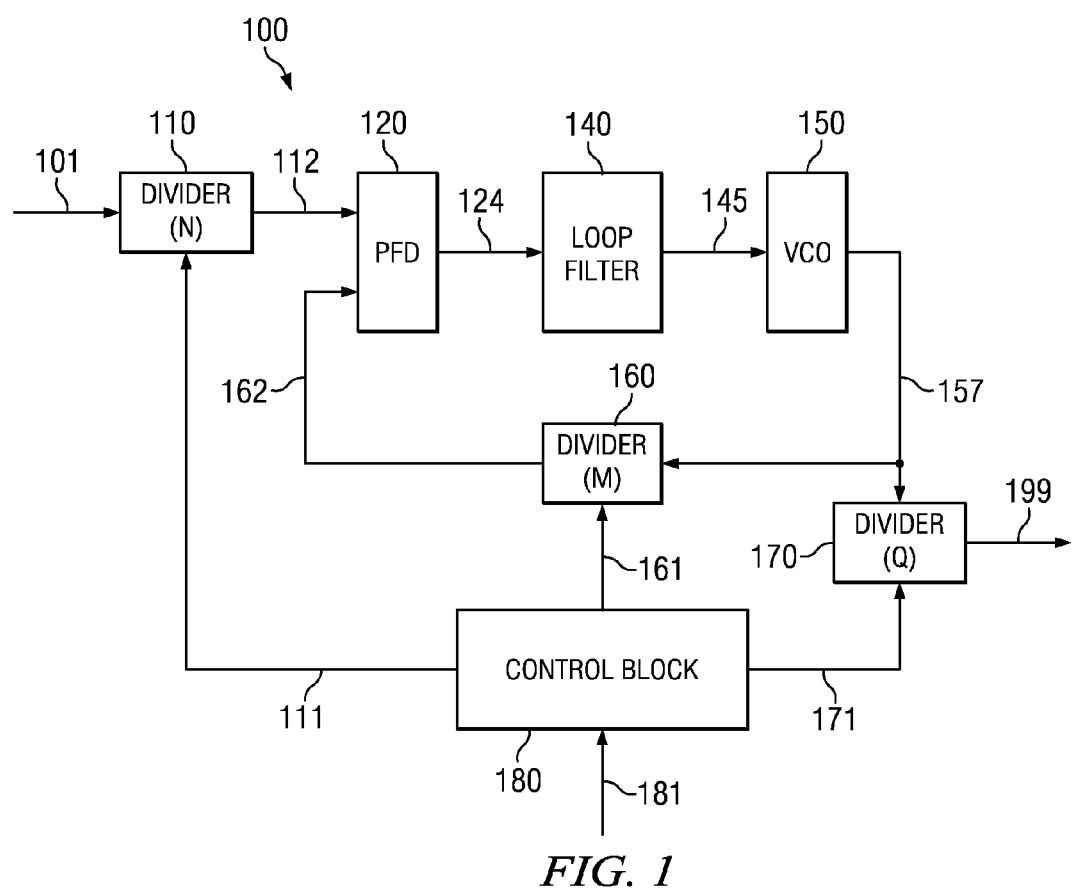
FIG. 1 is a block diagram of an example environment in which several embodiments can be implemented.

FIG. 1 is a block diagram illustrating an example environment in which several embodiments can be implemented. Phase locked loop (PLL) 100 of FIG. 1 is shown containing frequency dividers 110, 160 and 170, phase-frequency discriminator (PFD) 120, loop filter 140, voltage controlled oscillator 150 and control block 180. The components and blocks of FIG. 1 are shown merely by way of illustration. Other PLL implementations may contain more or fewer components/blocks. Further, embodiments of the present disclosure can be deployed in other environments or as part of other systems or components as well. PLL 100 receives an input signal of frequency F1 on path 101, and generates an output signal of frequency F2 on path 199. The ratio F2/F1 may be specified as an input (e.g., via path 181) to PLL 100.

Control block 180 receives a value (on path 181) specifying the ratio F2/F1 of the frequencies F2 and F1 of signals 199 and 101 respectively. The value(s) on path 181 may be generated, for example, by a processor, not shown. In response, control block 180 computes the values of division factors N, M and Q, and provides the division factors on respective paths 111, 161 and 171. Alternatively, control block 180 may receive separate values (A, B, and C) via path 181, and compute the value of factors N, M and Q based on respective values A, B and C. Control block 180 may dynamically change the value of one or more of factors N, M and Q while PLL 100 is in operation.

Divider 110 receives input signal 101, and divides the frequency of signal 101 by the factor N, and provides a frequency-divided signal on path 112. PFD 120 compares the phase difference between signals 112 and the output 162 of divider 160, and generates, on path 124, an error signal proportional to the phase difference. Loop filter 140 provides low-pass filtering on error signal 124, and generates a filtered signal on path 145. Voltage control oscillator (VCO) 150 generates a periodic signal (e.g., sine wave or square wave) on path 157, the frequency of the periodic signal being determined by the strength of signal 145. Divider 170 divides the frequency of signal 157 by the factor Q, and provides a frequency-divided signal as an output of PLL 100 on path 199.

Divider 160 divides the frequency of signal 157 by the factor M, and provides a frequency-divided signal to PFD 120 on path 162. Divider 160 receives programming inputs on path 161 specifying the value of division factor (M) that is to be used in dividing the frequency of signal 157 to generate signal 162.

PLL 100 may be implemented as an all-digital PLL, with each of components 110, 120, 140, 150, 160 and 170 being implemented as a digital component. In such an implementation VCO 150 may be implemented as a digitally controlled oscillator (DCO). In other implementations, one or more of the components of FIG. 1 may be implemented as analog or mixed-signal components/blocks. The frequency-division factors N, M and Q of dividers 110, 160 and 170 respectively may be programmable via corresponding inputs, as noted above. In an embodiment, PLL 100 is implemented to provide frequencies (of output signal 199) in a wide range, i.e., from very low frequencies to very high frequencies (e.g., of the order of 2 Giga Hertz). One or more of dividers 110, 160 and 170 may correspondingly need to be implemented to accommodate such high frequencies. Further, the dividers may need to support other requirements such as low jitter, seamless transition (dynamic change) from one divide ratio to another to provide glitch free outputs, etc.

2. Frequency Divider

Figure 2:
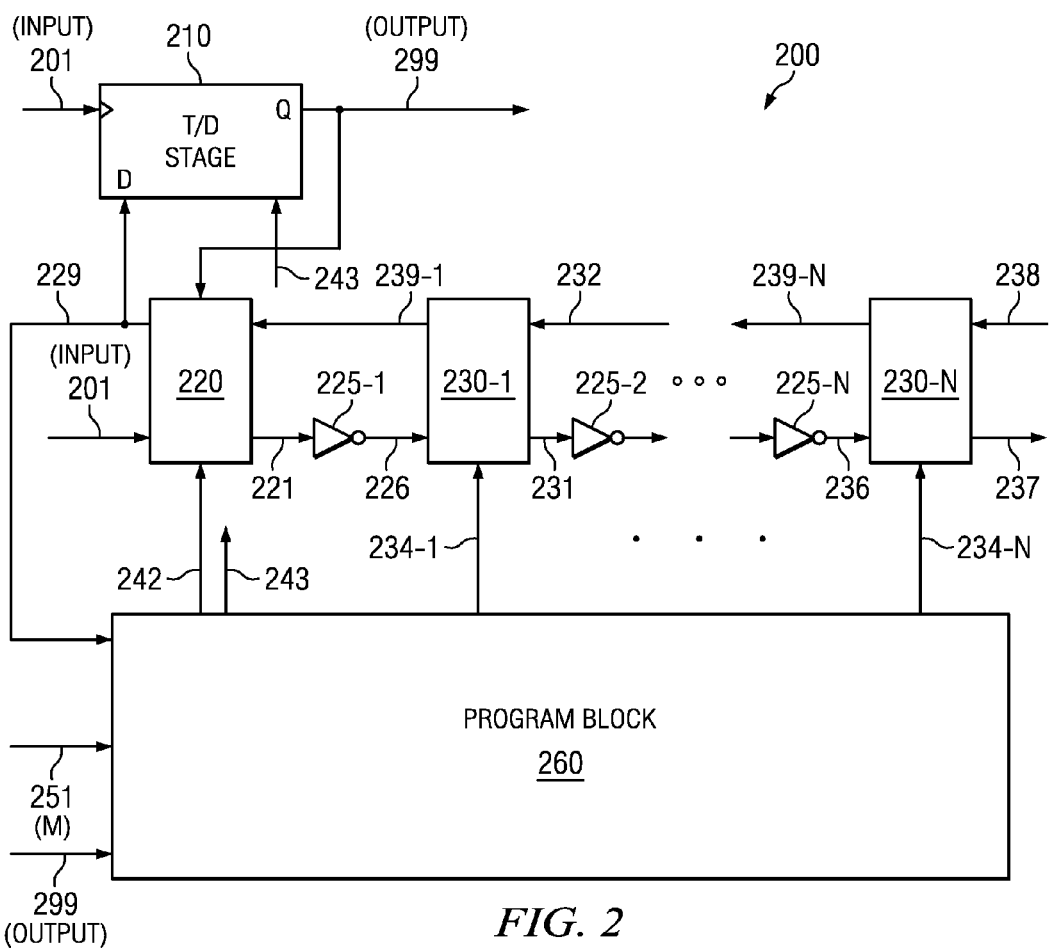
FIG. 2 is a block diagram of a frequency divider in an embodiment.

FIG. 2 is a block diagram of a frequency divider in an embodiment. Frequency divider 200 is shown containing T/D stage 210, frequency divider stages (stage) 220, and 230-1 through 230-N, inverters 225-1 through 225-N, and program block 260. Any of frequency dividers 110, 160 and 170 of FIG. 1 may be implemented as frequency divider 200.

When divider 160 is implemented as frequency divider 200, signals on paths 157 and 162 correspond respectively to signals 201(INPUT) and 299 (OUTPUT) of FIG. 2. Signals 201 (INPUT) and 299 (OUTPUT) are referred to herein also as the first input signal and the first output signal respectively. The division factor M by which frequency divider 200 is required to divide the frequency of 201 (INPUT) to generate 299 (OUTPUT) is received on path 251(M), which corresponds to path 161 of FIG. 1. In an embodiment, M can be any integer greater than or equal to 2. Stages 220, and 230-1 through 230-N are designed to divide the frequency of 201 (INPUT) by a factor P. P equals M/2 if M is an even number, and equals (M−1)/2 if M is an odd number. M[0] refers to the least significant bit (LSB) of the binary representation of M, with M[1], M[2], etc. referring to higher order bits of M. Similarly, P[0] refers to the LSB of the binary representation of P, with P[1], P[2], etc., referring to higher order bits of P. Stage 210 either performs a final divide-by-two operation (of the output provided by stages 220, and 230-1 through 230-N) or performs no division to generate 299 (OUTPUT).

Stage 220 (least significant stage) divides the frequency of an input signal received on path 201 by a division factor that is one of 2, 3 and 4 (i.e., divide-by-2, divide-by-3 and divide-by-4), and provides a frequency-divided output (first frequency-divided signal) on path 221. The divide-by-2, divide-by-3 and divide-by-4 operations may be viewed as a corresponding division mode. Any one of the division factors may be applied for the entire duration of operation of divider 200. Alternatively, one of the factors may be used for some time intervals, while the other factors are used in some other intervals, as described in greater detail with respect to FIG. 5. The logic level of output 221 is inverted by inverter 225-1, and provided as input to the next (higher) stage 230-1. The specific factor by which stage 220 divides input signal 201 to generate signal 221 depends on the value of a program bit (first program bit) and a signal EN-MOD-EXTEND (provided via path 242), signal 299(OUTPUT), and on the value of a "mode" signal (first input mode signal) received on path 239-1.

Stage 220 generates a mode signal (output mode signal/Modout[0]) on path 229. Stage 220 also receives output 299 as an input. Such coupling (output of stage 220 provided as one of the inputs to stage 210, and vice versa) enables minimization of the number of logic elements between any pair of flip-flops FF3, FF4 and FF5 (or a flip-flop external to stage 220 and any one of flip-flops FF3, FF4 and FF5), and thereby lends to high-speed operation and reduction in power consumption and implementation area of frequency divider 200.

The logic level of output 221 is inverted by inverter 225-1, and provided as an input to the next (higher) stage 230-1. 6. Inverters 225-2 through 225-N (only 225-2 and 225-N are shown in FIG. 2) are similarly employed between the other stages 230-1 through 230-N-1(230-N-1 is not shown in FIG. 2). The use of inverters 225-1 through 225-N ensures that input mode signals 239-1 through 239-N toggle on a falling edge of FF3 (shown in FIG. 5) of stage 220. As a result, AND gate 540 (which generates Modout[0]) is prevented from causing glitches on Modout[0].

Stage 230-1 divides the frequency of signal 226 received as an input by a division factor that is one of factors 2 and 3, and provides a frequency-divided output on path 231. The specific factor (2 or 3) by which frequency of input signal 226 is divided depends on the value of inputs provided on path 234-1 as well as on the value of a mode signal received as another input on path 232. Stage 230-1 generates a mode signal (MODOUT[1]) on path 239-1.

Each of stages 230-2 (stage 230-2 is not shown in FIG. 2) through 230-N similarly receives a corresponding input, divides the frequency of the corresponding input by a factor of 2 or 3, and generates a corresponding frequency-divided output signal. Each of stages 230-2 through 230-N receives a mode signal (MODIN[1] through MODIN[N] respectively) from an immediately next (higher) stage. Each of stages 230-2 through 230-N generates a corresponding mode signal (MODOUT[ ] through MODOUT[N] respectively) provided as input to the immediately previous (lower) stage. Stage 230-N is shown receiving input signal 236 via inverter 225-N and a corresponding mode signal (MODIN[N]) on path 238. Stages 230-1 through 230-N are referred to herein as higher stages, and are connected in sequential/cascaded fashion. Stages 230-1 through 230-N are also referred to herein as 'divide-by-2/3' stages. The total number 'N' of divide-by-2/3 stages is determined based on the maximum divide-by value (also referred to as the division factor M) that frequency divider 200 is required or designed to provide.

T/D stage 210 (also referred to herein as the output stage) receives Modout[0] (229) (first output mode signal) as an input. T/D stage 210 operates to either divide the frequency of signal 229 by a factor of 2, or to merely delay signal 229 by one cycle of signal 201(INPUT) received as a clock input, and generates an output signal (first output signal) on path 299 (OUTPUT). Signal 201 (INPUT) is the input signal provided to frequency divider 200 and to be frequency-divided by a desired number to generate output signal 299 (OUTPUT) of divider 200. The number or value that 201 (INPUT) is to be divided by, to generate 299 (OUTPUT), is specified or controlled via inputs 243, 242 and 234-1 through 234-N.

Program block 260 receives a divide-by value (M) on path 251(M) and the output signal 299 (OUTPUT). The divide-by value represents the frequency division factor (M) that frequency divider 200 needs to apply on signal 201 (INPUT) to generate signal 299 (OUTPUT). In response to receipt of M, program block 260 generates corresponding program values (program bits) and a select signal. Program block 260 provides the respective program bits to the respective ones of blocks 220 and 230-1 through 230-N via paths 242 and 234-1 through 234-N respectively, and the select bit to block 210 via path 243. Program block 260 provides (or forwards) the values on respective paths 242, 243 and 234-1 through 234-N in a manner to enable seamless switching between division factors, as described in sections below. The program values are generated to enable blocks 210, 220 and 230-1 (and thus frequency divider 200) to generate output signal 299 (OUTPUT) with a frequency that equals 1/M of the frequency of input signal 210 (INPUT).

The number of stages to be implemented in frequency divider 200 depends on the maximum value of division factor (M) that frequency divider 200 is designed to accommodate. For a maximum division factor M-max, one T/D stage (210), one divide-by-2/3/4 stage (220) and 'X' divide-by-2/3 stages need to be implemented. The value of X is determined as noted below:

For M-max=7 (i.e., for values of M from 1 through 7), X=0.
For M-max=15, X=1.
For M-max=31, X=2.
For M-max=63, X=3
In general, for M=1, 2 and 3, X=0. For higher values of M-max, the value of X is determined by the following relationship:

$$2^{(q-1)} <= M\text{-max} < (2^q), X=(q-3),$$

wherein, q is any positive integer, and
^ represents a 'to the power of' operation.

In response to a change in the value of division factor 'M' (from a current value to a new value), program block 260 operates to generate corresponding new program values on paths 242, 243 and 234-1 through 234-N. In an embodiment, program block 260 is implemented to ensure that the new program values are applied (that is forwarded on paths 242, 243 and 234-1 through 234-N) in a manner such that glitches and other undesirable effects in one or more of internal signals of frequency divider 200 (and hence on signal 299 (OUTPUT)) are prevented from occurring. Glitches in signal 299 refer to unintended (and undesirable) logic excursions of signal 299. Such glitches may otherwise occur during a transition period when frequency divider 200 switches from providing one (current) division factor to a new one. Program block 260 is implemented to ensure that switching between one division factor to another without causing glitches, as described in greater detail in sections below.

As noted above, each of dividers 110, 160 and 170 of FIG. 1 may be implemented as frequency divider 200 of FIG. 2, with dividers 110, 160 and 170 receiving division factors N, M and Q respectively, which in turn are generated by control block 180 based on corresponding divide factors A, B and C. With combined reference to FIGS. 1 and 2, in an embodiment of PLL 100 that supports spread spectrum techniques, the value of M is changed (by any integer value) at an edge of signal 229 (Modout[0]). The changes in M are varied about (i.e., values greater than as well as less than) the value B. Similarly, factors N and Q may also be changed at an edge of signal 229. The changes in N are varied about the value A.

In the embodiment, the value of Q may, at power-ON of PLL 100, be reduced slowly (for example, in steps) from a value higher than C to value C. Such slow reduction of division factor Q starting from a value higher than C to value C ensures that the current consumed by a device or component using 299 (OUTPUT) as an input clock or input signal does not abruptly increase from zero to a final value, but rather increases slowly, thereby relaxing the requirements of a power source used to power the device or component. Factors N, M and Q may each be any positive integer greater than or equal to 2. The blocks of FIG. 1 are described in detail next.

3. Divide-by-2/3 Stages

Figure 3:
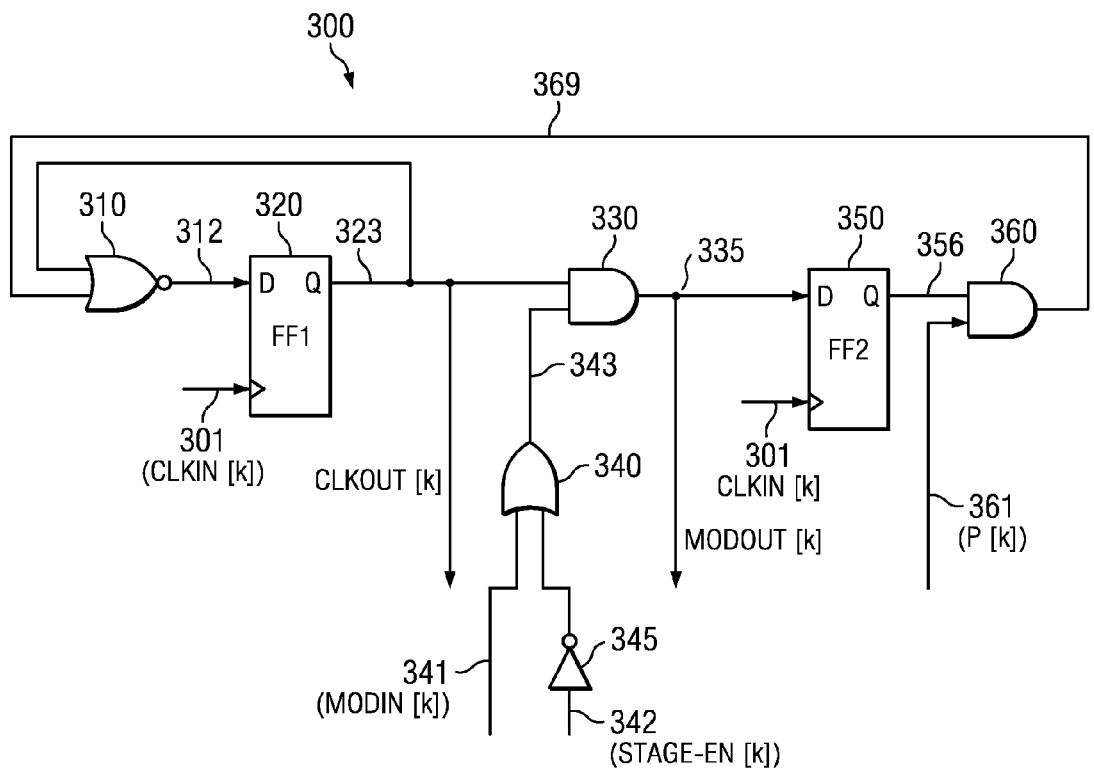
FIG. 3 is a block diagram illustrating the implementation details of a divide-by-2/3 stage used in a frequency divider in an embodiment.

FIG. 3 is a block diagram illustrating the implementation details of a divide-by-2/3 stage in an embodiment. Divide-by-2/3 stage 300 is shown containing NOR gate 310, flip-flop 320 (FF1), AND gates 330 and 360, OR gate 340, NOT gate 345 and flip-flop 350 (FF2). Each of stages 230-1 through 230-N of FIG. 2 is implemented as stage 300, and stage 300[k] therefore refers generically to any of such stages, with stages 300[1] through 300[N] referring respectively to stages 230-1 (first divider stage) through 230-N. Correspondingly, the inputs and outputs of stage 300[k] are also denoted to include the index k, with k ranging from 1 through N.

Stage 300[k] divides the frequency of input signal CLKIN [k] (301) by a factor that is either 2 (divide-by-2) or 3 (divide-by-3), based on program bit P[k] (361) and input mode signal MODIN[k] (341) to generate a corresponding frequency-divided output signal CLKOUT[k] (232). Signal CLKOUT [k] is at logic high for 1 period of input signal CLKIN[k], and at logic low for 1 or 2 periods of CLKIN[k], depending on whether divide-by-2 or divide-by-3 is to be performed by stage 300[k]. Stage 230-1 of FIG. 2 may be viewed as the first divider stage in the set of multiple divide-by-2/3 stages formed by stages 230-1 through 230-N.

Stage 300[k] generates signal MODOUT[k](335). MODOUT[k] is generated to be at logic high for one period of input clock CLKIN[k] in each cycle of the output signal CLKOUT of the rightmost stage enabled to be active (and also referred to as the highest significance stage) in divider 200. To clarify, assuming, stage 230-N (of FIG. 2) is the rightmost stage active (i.e., enabled to operate to divide the frequency of input signal 201) and referring to stage 230-1 (of FIG. 2) as stage 300[1], then MODOUT[1] is generated to be at logic high for one period of input signal CLKIN[1] (namely, signal 226) in each cycle of the output signal CLKOUT[N], namely, signal 237. MODOUT[k] is generated to be at logic low for the remainder of the period of output signal CLKOUT of the rightmost stage enabled to be active in divider 200.

Signal MODOUT[k] of stage 300[k] is connected as MODIN[k−1] of the previous stage 300[k−1], and specifies to stage 300[k−1] the time intervals in which stage 300[k−1] is to perform divide-by-3 operation, provided P[k−1] also permits such divide-by-3 division. Similarly, MODIN[k] of stage 300[k] is connected as MODOUT [k+1] of the next higher stage (stage 300[k+1]), and specifies to stage 300[k] the time intervals in which stage 300[k] is to perform divide-by-3 operation, provided P[k] also permits such divide-by-3 division. Signal P[k] of stage 300[k] is received from program block 260 (of FIG. 3), and has a value that depends on division factor M. A logic low (or logic 0) value of P[k] specifies that stage 300[k] is to always perform divide-by-2 operation. A logic high (or logic 1) value of P[k] specifies that stage 300[k] is to perform divide-by-3 operation in durations/intervals when MODIN[k] is at logic high, and perform divide-by-2 operation in durations/intervals when MODIN[k] is at logic low. The frequency of Modout[0](229 of FIG. 2) equals the frequency of the CLKOUT signal of the highest significance stage enabled to be active. For example, assuming that the value of M is such that all of stages 220, 230-1 through 230-N are enabled to be active/operational (for division), the frequency of Modout[0] equals the frequency of signal 237 (CLKOUT of the highest significance stage 230-N enabled to be active)

Signal CLKIN[k] of stage 300[k] is received as the logic inverse of CLKOUT[k−1] of stage 300[k−1]. The logic inverse of CLKOUT[k] of stage 300[k] is provided as CLKIN [k+1] of stage 300[k+1]. A set of stages 300[k] (a plurality of divider stages) connected as described above are referred to as being connected in cascade. The combination of stage 220 with stages 230-1 through 230-N may also be viewed as being connected in cascade.

A logic zero value of MODIN-EN[k] (enable signal) disables the effect of MODIN[k] of that stage (stage 300[k]), causing stage 300[k] to divide by 2 or 3 depending only on the value of its P input (P[k]), as if MODIN[k] were logic one. Thus, when MODIN-EN[K] is a logic zero, stage 300[k] divides by two if P[k] is a logic zero, and by three if P[k] is a logic one.

A logic one value of MODIN-EN[K] enables MODIN[k] also to affect the division performed by stage 300[k]. When MODIN-EN[K] is a logic one, stage 300[k] divides by two or by three (depending on the value of P[k] as noted above) only when MODIN[k] is a logic one. When MODIN[k] is a logic zero (with MODIN-EN[k] being logic one), stage 300[k] divides by two.

If MODIN-EN[k] of stage 300[k] is a logic zero, then all higher stages (stage 300[k+1], stage 300[k+2], etc) are not required to be in operation and may be maintained in a reset state (i.e., disabled from operating). In such a scenario, the lowest (least significant) of such stages 300[k] for which MODIN-EN[k]=0, represents the highest significance stage, and the frequency of Modout[0] equals the frequency of CLKOUT[k].

With combined reference to FIG. 2 and FIG. 3, signals MODIN-EN[k] and P[k] of each stage 300[k] are received from program block 260. Thus, for example, referring to stage 230-1 as stage 300[1], MODIN-EN[1] and P[1] of divide-by-2/3 block 230-1 (of FIG. 1) are received from program block 260 via path 234-1. Signal 226 corresponds to CLKIN[1], signal 231 corresponds to CLKOUT[1], signal 232 corresponds to MODIN[1] and signal 239-1 corresponds to MODOUT[ ]. Similarly, denoting stage 230-N as stage 300[N], MODIN-EN[N] and P[N] of divide-by-2/3 block 230-N are received from program block 260 via path 234-N. Signal 236 corresponds to CLKIN[N], signal 237 corresponds to CLKOUT[N], signal 238 corresponds to MODIN[N] and signal 239-N corresponds to MODOUT[N]. Assuming all of blocks 220 and 230-1 through 230-N are enabled (and to be operated for frequency division), 230-N represents the highest (or rightmost) divide-by-2/3 stage of frequency divider 200, and each of MODIN-EN[1] through MODIN-EN[N] would be enabled (logic high). MODIN[N] (in general MODIN of the highest enabled stage) is set to logic high.

CLKIN[k] is provided as the clock input to the clock terminals of positive edge-triggered flip-flops FF1 and FF2. NOR gate 310 performs a logic NOR operation on output 369 of AND gate 360 and the Q output 323 of FF1, and provides the result on path 312 as the D input of FF1. CLKOUT[k] is the Q output 323 of FF1. Inverter 345 performs a logic NOT operation on signal 342 (MODIN-EN[k]) and provides the inverse of signal 342 on path 345. OR gate 340 provides on path 343 the logic OR result of signal 341 (MODIN[k]) and signal 345. AND gate provides on path 335 the logic AND result of signal 343 and 323. Signal 335 is provided as the D input of FF2. Signal 335 is also provided as output signal MODOUT[k]. AND gate provides the result of an AND operation on signals 356 (Q output of FF2) and signal 361 (P[k]). The number of combinatorial elements in signal paths between FF1 and FF2, and from/to FF1 and FF2 from any other flip-flop (memory element, in general) within or outside of stage 300[k] is less than a prior implementation of a divide-by-2/3 stage, and hence lends to relatively higher speed of operation and lesser power consumption and area required to implement stage 300[k].

Figure 4A:
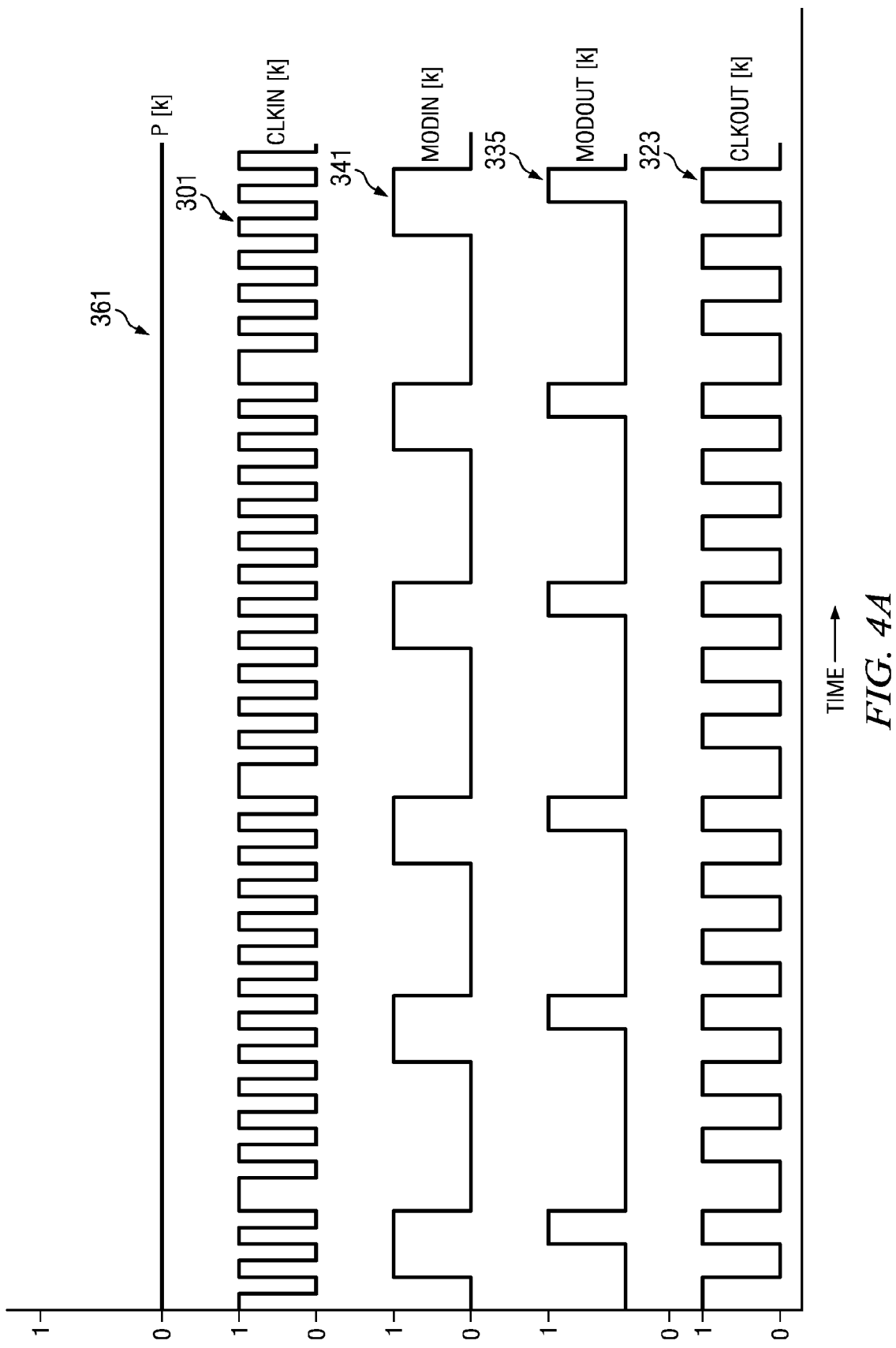
FIG. 4A is a diagram illustrating example waveforms at some nodes of a divide-by-2/3 stage used in a frequency divider in an embodiment.
Figure 4B:
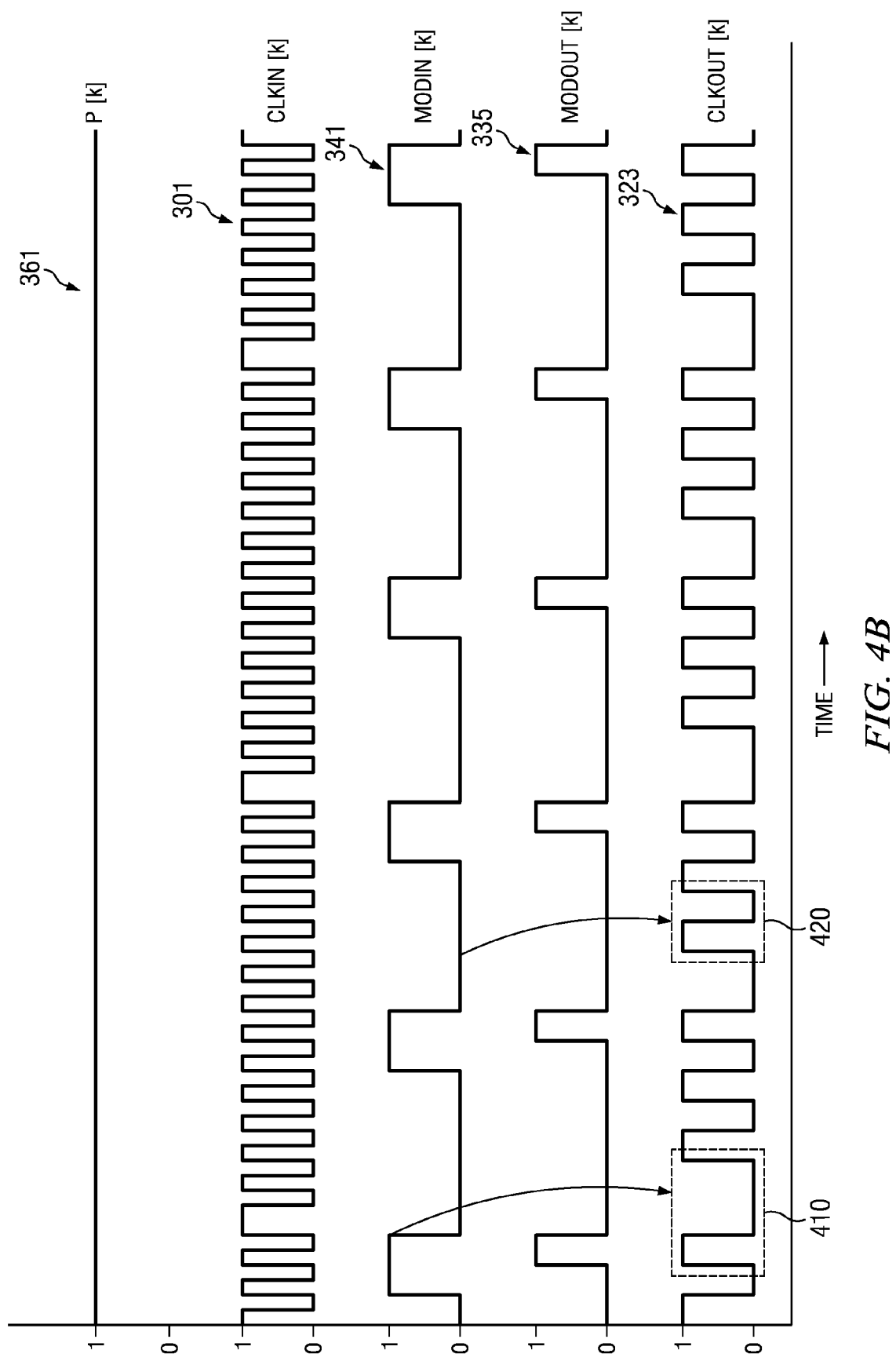
FIG. 4B is another diagram illustrating example waveforms at some nodes of a divide-by-2/3 stage used in a frequency divider in an embodiment.

FIGS. 4A and 4B show example waveforms at some nodes of the circuit of FIG. 3. FIG. 4A shows example waveforms at nodes 361, 301, 341, 335 and 323 of stage 300[k] of FIG. 3 when the value of P[k] provided on node 361 is a logic zero. As noted above, a value of zero of P[k] causes stage 300[k] to operate in divide-by-2 mode with CLKOUT[k] being alternately at logic high and logic low, as may be observed by comparing the waveforms at nodes 301(CLKIN[k]) and 323 (CLKOUT[k]). When P[k] equals zero, signal MODIN[k] does not affect the divide operation, and stage 300[k] operates solely in divide-by-2 mode.

FIG. 4B shows example waveforms at nodes 361, 301, 341, 335 and 323 of stage 300[k] of FIG. 3 when the value of P[k] provided on node 361 is a logic one. When P[k] is at logic one, stage 300[k] operates in divide-by-3 mode in response to a logic one level of MODIN[k] (as indicated by arrow 410), and in divide-by-2 mode when MODIN[k] is a logic zero (as indicated by arrow 420). Thus, CLKOUT[k] is alternately at logic high for one period of CLKIN[k] and at logic low for one or two periods of CLKIN[k], depending on the value of MODIN[k].

Figure 4C:
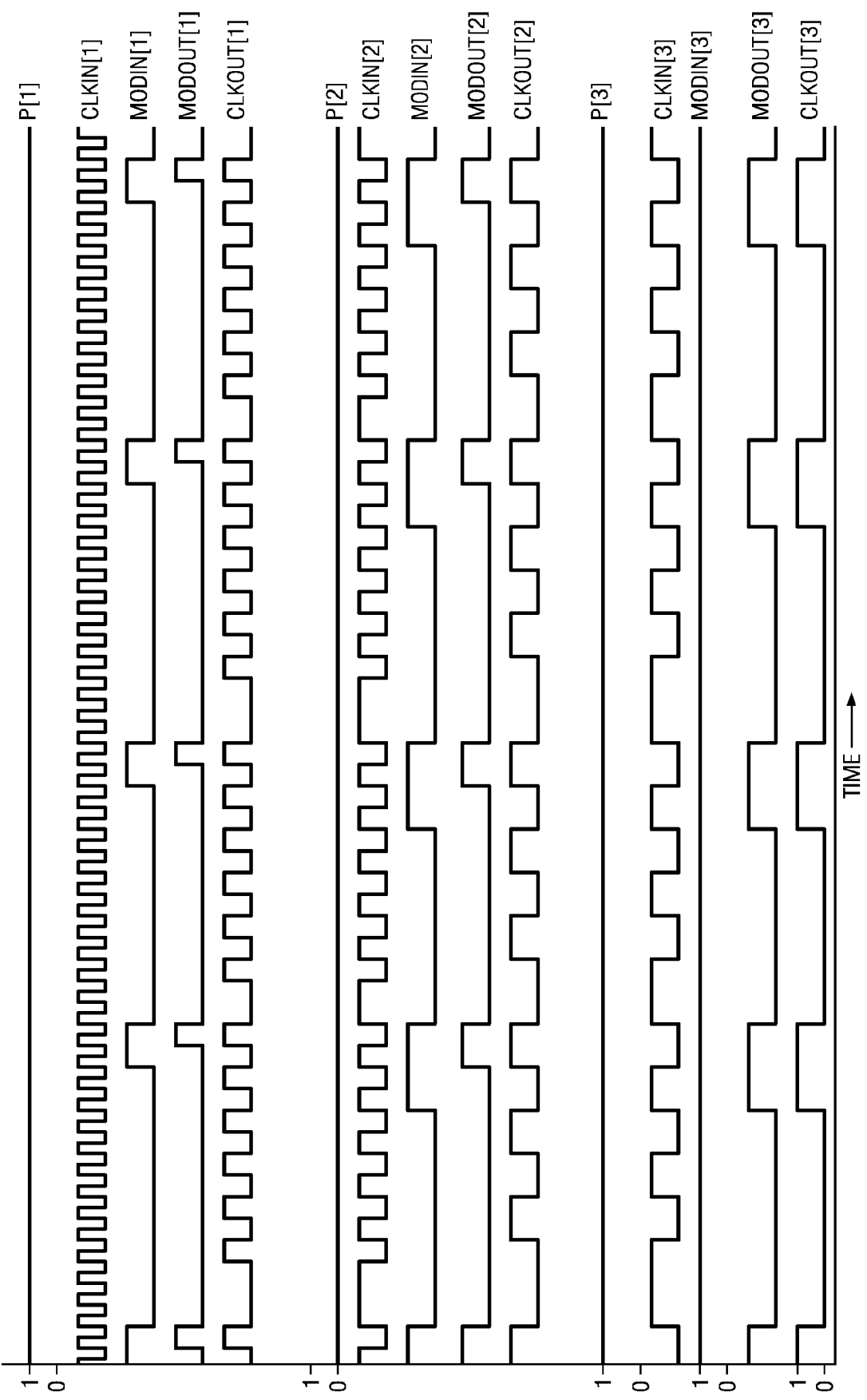
FIG. 4C is a diagram illustrating example waveforms at some nodes of each of three cascaded stages implemented as a divide-by-2/3 stage in an embodiment.

FIG. 4C shows waveforms at the P, CLKIN, MODIN, MODOUT and CLKOUT nodes of three cascaded stages 300[1], 300[2], and 300[3], each implemented as shown in FIG. 3. The respective inputs and outputs of each stage are connected as described above with respect to FIG. 3. CLKIN [1] is an input clock that is to be divided, and may be received from an external source. It is assumed in the example that CLKIN[1] is to be divided by thirteen (1101 in binary). P inputs of 1, 0 and 1 to respective stages 300[1], 300[2] and 300[3] equal the least three significant bits (1, 0 and 1) of the binary number 1101. It is noted that three stages are required for the overall divide-by-13 operation, as each stage by itself is can divide by 3. MODIN[3] of stage 300[3] is set to logic one.

It may be observed from FIG. 4C that the frequency of CLKOUT[3] is 1/13 that of CLKIN[1]. It may also be observed that MODOUT[1] is at logic high (only) for one period of CLKIN[1] in each cycle of CLKOUT[3] (which is the CLKOUT of the rightmost (highest) stage, stage 300[3] in the example), and is at logic zero otherwise. Similarly, MODOUT[2] is at logic high only for one period of CLKIN[2] in each cycle of CLKOUT [3]. It may also be observed from FIG. 4C that MODOUT [1] also has a frequency that is 1/13 that of CLKIN[1].

4. Divide by 2/3/4 Stage

Figure 5:
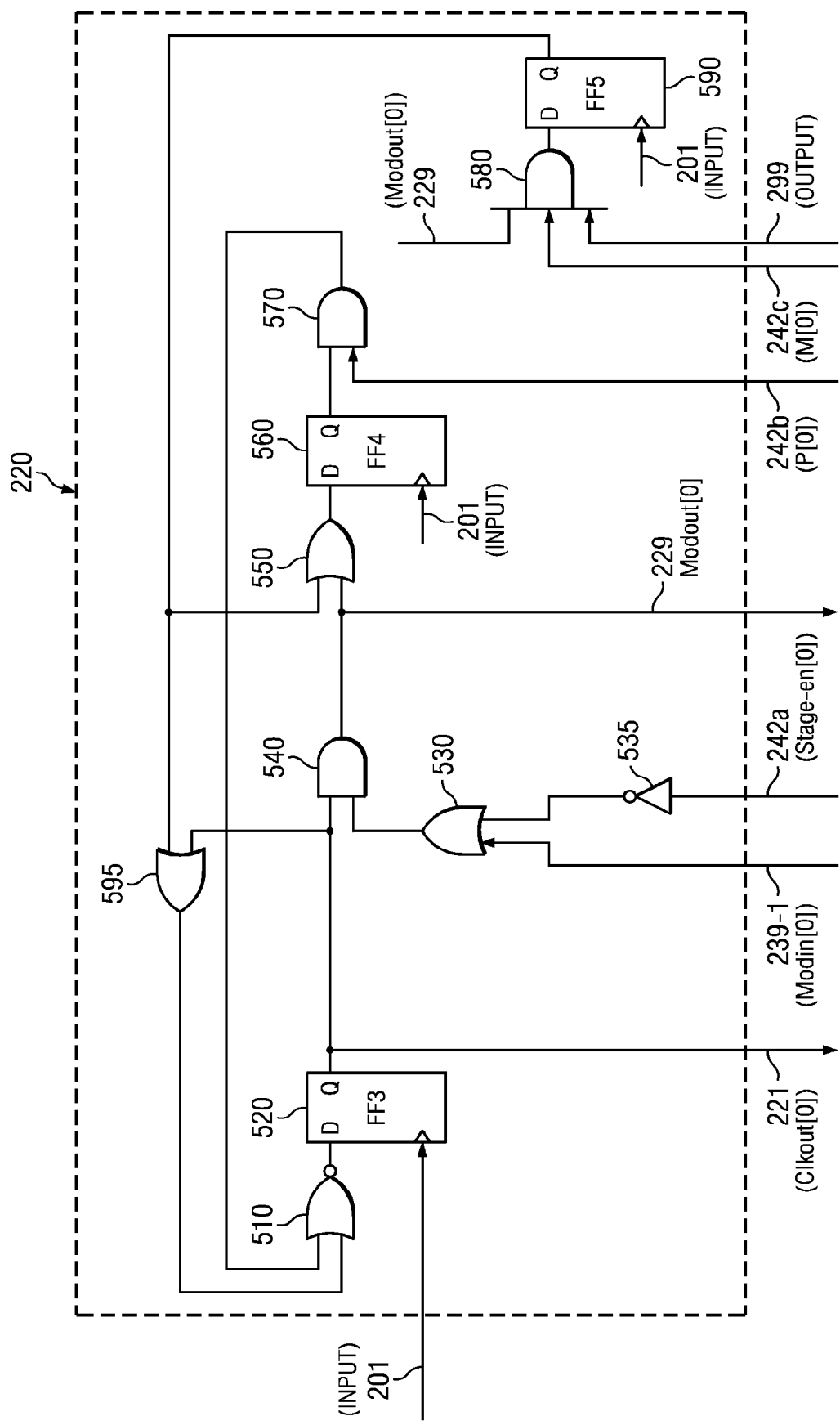
FIG. 5 is a diagram illustrating the implementation details of a divide-by-2/3/4 stage used in a frequency divider in an embodiment.

FIG. 5 is a diagram illustrating the implementation details of a divide-by-2/3/4 stage in an embodiment. The diagram is shown containing NOR gate 510, flip-flops 520 (FF3), 560 (FF4) and 590 (FF5), OR gates 530, 550 and 595, inverter 535, AND gates 540, 570 and 580. In frequency divider 200 (of FIG. 2), the least significant stage (LS stage 220) is implemented as the divide-by-2/3/4 stage of FIG. 5. Stage 220 is designed to perform divide-by-2, divide-by-3 or divide-by-4 division based on values of program and other input signals as described below. Signals 242a, 242b and 242c are assumed to be included in path 242 (FIG. 2). Stage 220 is referred to as the least significant (LS) stage since stage 220 receives the least significant bit of the P.

Inverter 535 provides as output, the logic inverse of signal 242a (Modin-en[0]). OR gate 530 provides as an output, the result of a logic OR operation of signals 239-1 (Modin[0] (first mode signal)) and the logic inverse of signal 242a (Modin-en[0]). AND gate 540 provides the logical AND of the output of OR gate 530 and the Q output 221 (Clkout[0] (first frequency-divided signal)) of FF3 as output 229 (Modout[0] (output mode signal)). OR gate 550 provides as output the logical OR result of the output of the AND gate 540 and the Q output of FF5, the output of OR gate 550 being provided as the D input of FF4. AND gate 570 provides as output, the logical AND of signal 242b (program bit P[0]) and the Q output of FF4. Three-input AND gate 580 provides as output the logical AND result of signals 229, 242c (EN-MOD-EXTEND) and 299 (OUTPUT) (of FIG. 2), the output being provided as the D input of FF5. OR gate 595 provides as an output, the logical OR result of the Q output of FF3 and FF5. NOR gate 510 provides as an output, the logical NOR result of the output of OR gate 595 and the output of AND gate 570, the output being provided as the D input of FF3. Each of FF3, FF4 and FF5 is shown implemented as a positive edge-triggered flip-flop, and is clocked by signal 201 (INPUT) (FIG. 1). However, in other embodiments, the flip-flops may be implemented differently. Signal 242c (EN-MOD-EXTEND) (also referred to herein as the third bit) equals the least significant bit (M[0]) of the binary representation of the division factor M if M is greater than 4, and equals 0 if M is less than or equal to 4.

The implementation of FIG. 5 of stage 220 contains minimal combinatorial logic in signal paths between flip-flop pairs (formed of FF3, FF4 and FF5). Further, the number of logic elements between flip-flop pairs are roughly equal, to enable timing critical paths to short in length. As a result, the implementation of FIG. 5 may accommodate high operational speed, consume less power and be implemented in a smaller area. Further, the design of stage 220 ensures that the Modout[0] is at logic high for only one period of signal 201 (INPUT), thereby enabling the Modout[0] can be used as the D input of the flip-flop in T/D stage 210. The use of inverters between the CLKOUT of one stage and CLKIN of another (as shown in FIG. 2) ensures that all the MODIN signals toggle on the falling edge of FF3 (520 of FIG. 5). Hence, signal Modout[0] may be rendered glitch-free.

A logic zero value of Modin-en[0] disables the effect of Modin[0] on stage 220, causing stage 220 causing stage 220 to operate as if Modin[0] were logic 1.

A logic one value of Modin-en[0] enables of Modin[0] also to affect the division performed by stage 220.

If Modin-en[0] of stage 220 is a logic zero, then all higher stages (stages 230-1 through 230-N) are not required to be in operation and may be maintained in a reset state (i.e., disabled from operating). In such a scenario, stage 220 represents the highest significance stage, and the frequency of Modout[0] equals the frequency of Clkout[0].

The operation of divider 220 of FIG. 5 to perform divide-by-2, divide-by-3 or divide-by4 division of signal 201 (INPUT) is described by the following logic:

When signal Modin[0] (239-1) equals 0 (logic low), divider 220 performs divide-by2, and signal 221 (Clkout[0]) is alternately at logic high and logic low. When signal Modin[0] equals 1 (logic high) and if M[1] equals 0, divider 220 performs divide-by-2 and divide-by-3 in alternate half-periods of signal 299 (OUTPUT). When signal Modin[0] equals 1 and if M[1] equals 1, divider 220 performs divide-by-3 and divide-by-4 in alternate half-periods of signal 299 (OUTPUT).

As an example, if M equals 13, P (i.e., (M−1)/2 equals 6 (110 in binary), and M[1] (also equal to P[0]) is even. Therefore, when signal Modin[0] is at logic high, divider 220 performs divide-by-2 and divide-by-3 in alternate half-periods of signal 299 (OUTPUT). On the other hand, if when M equals 15, P equals 7 (111 in binary), and M[1] (also equal to P[0]) is odd. Therefore, when signal Modin[0] is at logic high, divider 220 performs divide-by-3 and divide-by-4 in alternate half-periods of signal 299 (OUTPUT). Divide-by-4 operation is required to accommodate those values of division factor M for which P[0] equals 1 (e.g., M=11, M=15, M=19). When M[1] is odd, alternate half-cycles of signal 221 (Clkout[0]) need to be at logic high for X cycles of 201 (INPUT) and at logic low for the next X+1 cycles of 201 (INPUT), wherein X equals (M−1)/2. For example, for a division factor M of 31 (with T/D stage 210 providing the final divide-by-two), alternate half-cycles of signal 221 (Clkout[0]) need to be at logic high for 15 cycles of 201 (INPUT) and at logic low for the next 16 cycles of 201 (INPUT).

Divider 220 is designed such that that the condition (Modin[0]=1) occurs for only one period of signal 201 (INPUT) in every half-period of signal 299 (OUTPUT). With combined reference to FIG. 5 and FIG. 2, signal 229 (Modout[0]) is provided as an input to T/D stage 210 (of FIG. 2), which either divides signal 229 by two or provides signal 229 without further division, but with a delay equal to one cycle of 201 (INPUT).

Figure 6A:
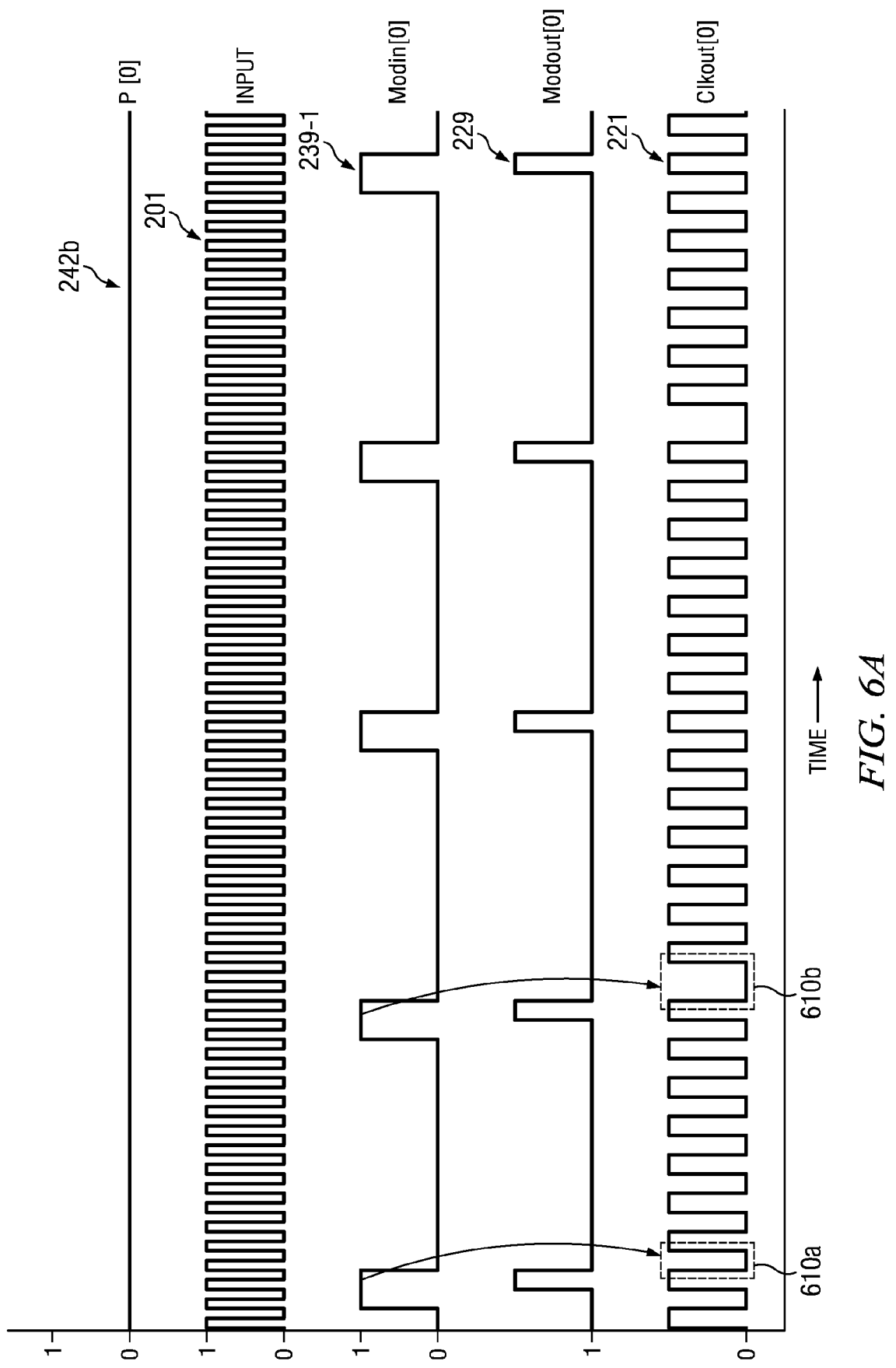
FIG. 6A is a diagram illustrating example waveforms at some nodes of a divide-by-2/3/4 stage used in a frequency divider in an embodiment.
Figure 6B:
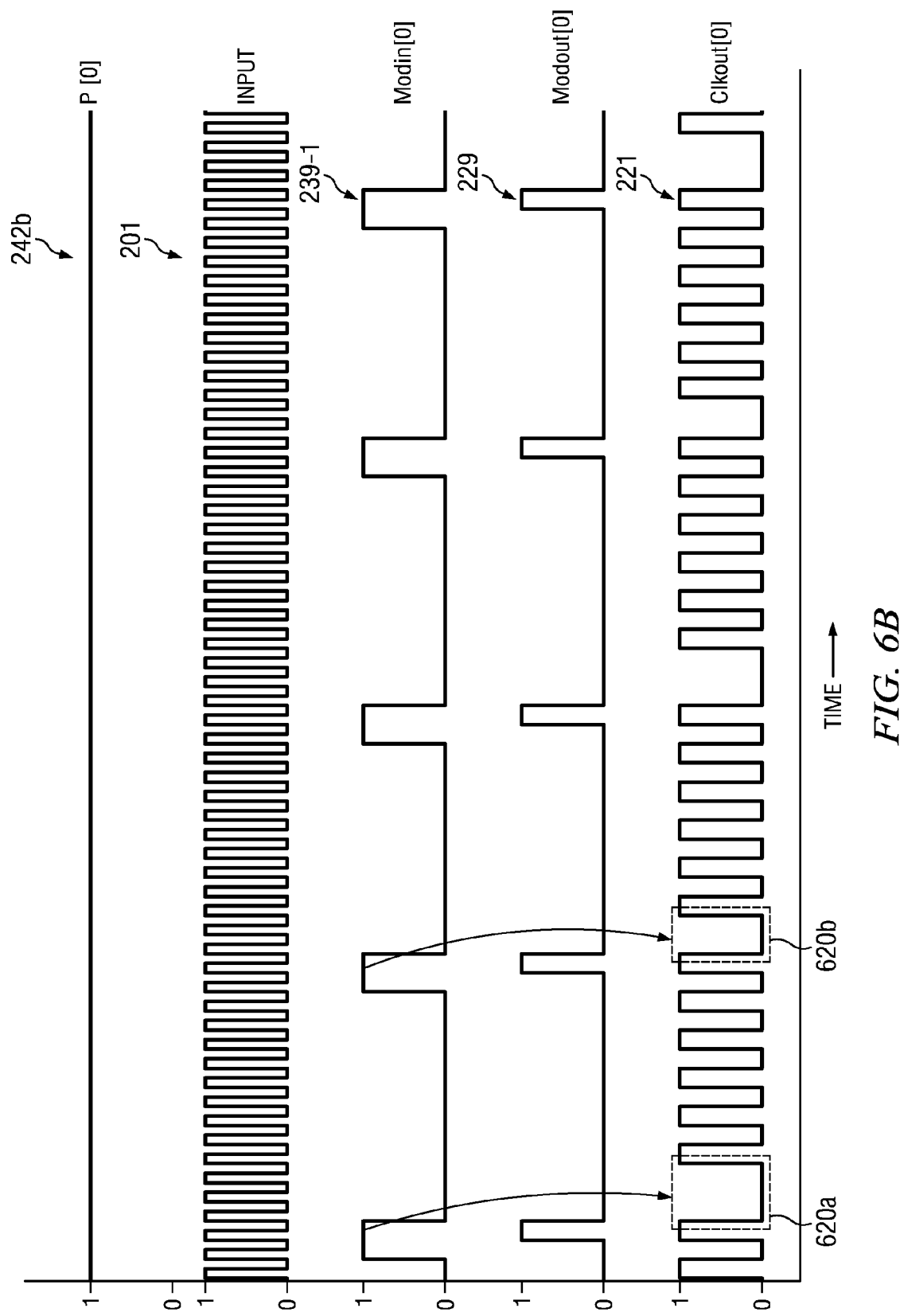
FIG. 6B is another diagram illustrating example waveforms at some nodes of a divide-by-2/3/4 stage used in a frequency divider in an embodiment.

FIGS. 6A and 6B show example waveforms at some nodes of the circuit of FIG. 5. FIG. 6A shows example waveforms at nodes 242b (P[0]), 201 (INPUT), 239-1 (Modin[0]), 229 (Modout[0]) and 221 (Clkout[0]) of divider 220 (of FIG. 5) when M[1]=0, i.e., M/2 ratio is even (the value of the P bit being the same as M[1]). It may be observed that signal 221 (Clkout[0]) has a frequency that is half of signal 201 (INPUT), and is alternately at logic high and logic low in intervals when 239-1 (Modin[0]) is zero. However, immediately following a logic one to logic zero transition of Modin[0], signal 221 (Clkout[0]) is at logic zero for two cycles of 201(INPUT) at every alternate cycle of Modin[0]. To clarify, 221 (Clkout[0]) is at logic zero for only one cycle of 201 (INPUT) in the instance denoted by arrow 610a, but for two cycles of 201(INPUT) in the next instance indicated by arrow 610b, and this pattern repeats, as may be observed from the values of Clkout[0] at other instances in FIG. 6A when Modin[0] is at logic one (or transitions from logic one to logic zero).

Thus, divider 220 divides by 2 and 3 alternately (at alternately cycles of Modin[0]) for logic high values of Modin[0]. Divider 220 divides by 2 at all other times.

FIG. 6B shows example waveforms at nodes 242a (P[0]), 201 (INPUT), 239-1 (Modin[0]), 229 (Modout[0]) and 221 (Clkout[0]) of stage 220 of FIG. 5 when M[1]=1, i.e., M/2 ratio is odd (the value of the P[0] bit being the same as M[1]). It may be observed that signal 221 (Clkout[0]) has a frequency that is half of signal 201 (INPUT), and is alternately at logic high and logic low in intervals when 239-1 (Modin [0]) is zero. However, signal 221 (Clkout[0]) is at logic zero alternately (i.e., every alternate logic high to logic low transition of Modin[0]) for 2 and 3 cycles of 201(INPUT) immediately following logic one to logic zero transitions of Modin [0]. To clarify, 221 (Clkout[0]) is at logic zero for three cycles of 201(INPUT) in the instance denoted by arrow 620a, but for two cycles of 201(INPUT) in the next instance indicated by arrow 620b, and this pattern repeats, as may be observed from the values of Clkout[0] at other instances in FIG. 6B when Modin[0] is at logic one (or transitions from logic one to logic zero). Thus, divider 220 divides by 3 and 4 alternately (at alternately cycles of Modin[0]) corresponding to logic high values of Modin[0]. Divider 220 divides by 2 at all other times.

The additional "extensions" of the logic zero levels of Clkout[0] are controlled by signals MO (which is the LSB of division factor M), and the specific half-cycle of 299 (OUTPUT) as indicated by signal 299. Such extensions are generated immediately following the corresponding (alternate) transitions of Modin[0] from logic high to logic low, as may be observed from FIGS. 6A and 6B.

5. T/D Stage

Figure 7:
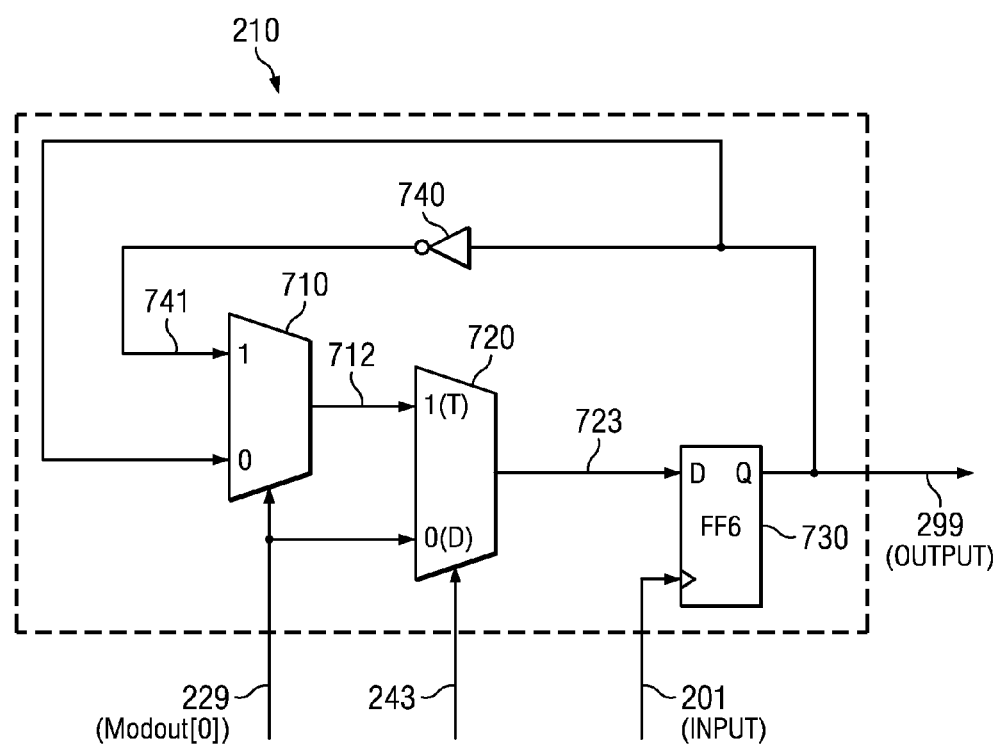
FIG. 7 is a diagram illustrating the implementation details of an output stage used in a frequency divider in an embodiment.

FIG. 7 is a diagram illustrating the implementation details of T/D stage 210 in an embodiment. T/D (Toggle/Delay) stage 210, also referred to as output stage, is shown containing multiplexers (MUX) 710 and 720, flip-flop 730 (FF6) and inverter 740.

MUX 710 receives signal 229 (Modout[0]) as a select signal, and provides as output 712, one of signals 299 (OUTPUT) and 741 based on the value of signal 229. In FIG. 7, it is assumed that a logic high value of signal 229 selects 741 as output 712, and a logic low of signal 229 selects signal 299 as output 712. MUX 720 receives signal 243 (FIG. 2) as a select signal, and provides one of signals 712 and 229 as output 723 based on the value of signal 243. Signal 723 is provided as the D input of flip-flop 730 (FF6). The Q output of FF6 is provided as the output 299 (OUTPUT) of frequency divider 200. Signal 229 is provided as one input to MUX 710. The inverse of signal 299 generated by inverter 740 is provided on path 741. FF6 is shown implemented as a positive edge-triggered flip-flop, and receives 201 (INPUT) as its clock input.

Since FF6 operates with signal 201 (INPUT) as its clock signal, the extent of power-supply jitter transferred from the power-supply (used to power frequency divider 200, not shown) to output 299 (OUTPUT) is much less than if FF6 were to receive the CLKOUT of the highest enabled stage as its input clock signal. Further, the delay (latency) between input 201 and output 299 is also is much less compared to an implementation in which FF6 (or T/D stage 210 in general) were to receive the CLKOUT of the highest enabled stage its as input clock signal.

In operation, for division factors M less than 4, select input (or mode bit) 243 sets T/D stage 210 in 'Delay' mode, with signal 243 equaling logic zero and MUX 720 providing signal 229 as output 723. In 'Delay' mode, T/D stage 210 (specifically FF6) forwards signal 229 (Modin[0]) as 299 (OUTPUT) after a delay equaling one cycle (period) of 201(INPUT). For division factors M greater than or equal to 4, select input 243 sets T/D stage 210 in 'Toggle' mode, with signal 243 equaling logic one, and MUX 720 providing signal 712 as output 723. In 'Toggle' mode, when a logic high is sensed on Modout(0), (shown in FIG. 8 as being sensed at the high to low transition of Modout(0)), the Q output of FF6 (i.e., signal 229 (OUTPUT)) toggles from its current state (i.e., switches to logic high if currently at logic low, and vice versa). Signal 229 (OUTPUT) has equal high and low durations, except for odd values of M. When M is odd, there is a difference of one 201 (INPUT) period between the high and low times of 299 (OUTPUT). For example, for an M value of 72, signal 299 (OUTPUT) is at logic high for 36 cycles of 201 (INPUT) and at logic low for 36 cycles of 201 (INPUT). For an M value of 73, signal 299 (OUTPUT) is at logic high for 36 cycles of 201 (INPUT) and at logic low for 37 cycles of 201 (INPUT). Signal 229 is at logic high for a duration of one period of signal 201 (INPUT) in every cycle CLKOUT of the highest stage enabled to operate in frequency divider 200.

Figure 8:
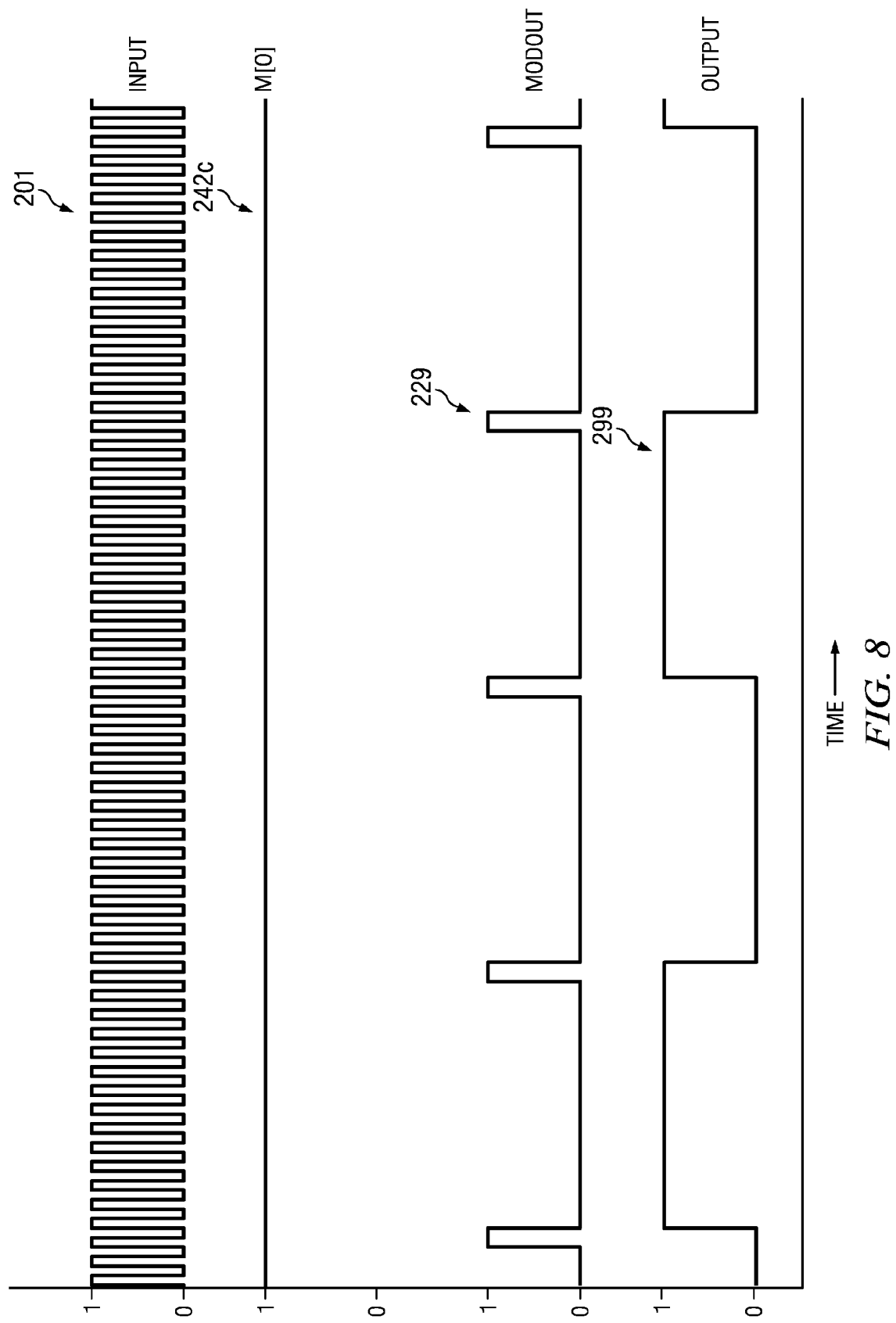
FIG. 8 is a diagram illustrating example waveforms at some nodes of an output stage used in a frequency divider in an embodiment.

FIG. 8 is a diagram illustrating example waveforms of signals 201, 242c, 229 and 299. It is assumed in the example of FIG. 8 that division factor M is greater than 4 and odd. It may be observed that signal 299 (OUTPUT) has one extra logic-low duration than logic-high, since 242c (EN-MOD-EXTEND) is one (odd). Also, since M is assumed to be greater than 4, T/D stage 210 operates in 'Toggle' mode as described above.

Frequency divider 200 is designed to switch from one division factor to another division factor seamlessly, i.e., the output (299) of frequency divider 200 is enabled to switch from one frequency to another (desired new) frequency without exhibiting any glitches. In addition, such seamless switching (in general glitch-free operation) may need to ensure that the output (299) does not exhibit wrong divisions (unintended time periods) at or around the instance of switching from one frequency to another, nor blank out for any length of time. In general, seamless switching may require that a current cycle of output 299 be completed, and a new cycle corresponding to the desired new frequency commence without any gaps or glitches in output 299. Such capability enables the division factor M of frequency divider 200 to be dynamically changed, without resulting in one or more of the undesirable effects noted above. Program block 260 is implemented to support such seamless switching. In addition, program block 260 also generates program values on paths 242, 243, and 234-1 through 234-N. The manner in which program block 260 operates in an embodiment to generate the inputs noted above is described next.

6. Program Block

Program block 260 (of FIG. 2) receives a division factor M on path 251(M) and provides program values on paths 242, 243, and 234-1 through 234-N. In response to receipt of a division factor M, program block 260 decodes M to generate P inputs (P[0] to be provided to stage 220, P[1] through P[N] to be provided to stages 230-1 through 230-N respectively), stage enable signals (Modin-en[0] to be provided to stage 220), MODIN-EN[1] through MODIN-EN[N] to be provided to stages 230-1 through 230-N respectively), T/D mode (signal 234) and EN-MOD-EXTEND. The signals, thus generated, are applied (or provided) by program block 260 to the corresponding elements of frequency divider 260 only when an 'align condition' is met, as described below. First, however, the manner in which the above program inputs (or program bits) are generated is described below. In the description below a logic zero (or low) corresponds to 0, and a logic one (or high) corresponds to one.

Generation of P Inputs:

If division factor M is equal to 2, P equals 0, and T/D mode is set to Delay mode. Thus, program block 260 generates P[1] through P[N] as logic zero, and T/D mode bit (243) also as logic 0.

If M is greater than 2 and M is even, program block 260 generates a value 'P' equal to M/2, wherein P[0], P[1] through P[N] represent corresponding bits of the binary representation of 'P', wherein P[0] is the LSB of the binary representation of 'P', with P[1] through P[N] representing successively the more significant bits, P[N] being the most significant bit (MSB). If M is odd, program block 260 generates the value 'P' to equal (M−1)/2. As noted above, P[0], P[1] through P[N] represent the corresponding bits of the binary value of 'P' thus obtained.

Generation of Modin-en Inputs:

For values of M equal to 2 and 3, Modin-en[0] is set to logic high (1), and MODIN-EN[k] is set to logic low(0), for all values of k.

For higher values of M, the Modin-en signals are generated as specified by the expressions below:

For $M=2^x$ to $2(x+1)-1$, wherein $x>=2$, En(y) for values of y from 0 through (x−2) are set to 1, and En(y), for all values of y>x−2 are set to 0.

In the expression above, En(0) is stage-en[0], and En(1) through En(N−1) respectively equal MODIN-EN[1] through MODIN-EN[N].

For example, for values of M=4 through 7 (i.e., corresponding to x=2), stage-en[0] is set to 1, MODIN-EN[1] through MODIN-EN[N] are set to 0. For values of M=8 through 15 (i.e., corresponding to x=3), stage-en[0] and MODIN-EN[1] are set to 1, MODIN-EN[2] through MODIN-EN[N] are set to 0. For values of M=16 through 31 (i.e., corresponding to x=4), stage-en[0], MODIN-EN[1] and MODIN-EN[2] are set to 1, and MODIN-EN[3] through MODIN-EN[N] are set to 0.

Generation of T/D Mode Signal/Bit (on Path 243):

If M is less than 4, program block 260 generates T/D mode signal (path 243) as a logic zero (delay mode). If M is greater than or equal to 4, program block 260 generates T/D mode signal (path 243) as a logic one (toggle mode).

Generation of En-Mod-Extend:

Program block 260 forwards M[0] as EN-MOD-EXTEND on path 242c of FIG. 5, if M is greater than 4. If M is less than or equal to 4, signal EN-MOD-EXTEND on path 242c is set to logic zero.

Having thus generated (but not yet provided on the corresponding ones of paths 242, 243, and 234-1 through 234-N) the program inputs, program block 260 waits for an 'align condition' to occur. An 'align condition' is deemed to occur at a rising edge of signal 229 Modout[0] (also provided as an input to program block 260 as shown in FIG. 2), when such a rising edge of signal 229 occurs when (or simultaneously as) the following additional logical condition is satisfied:

Immediately previous T/D mode was set to Delay mode OR output clock is at logic zero.

Figure 9:
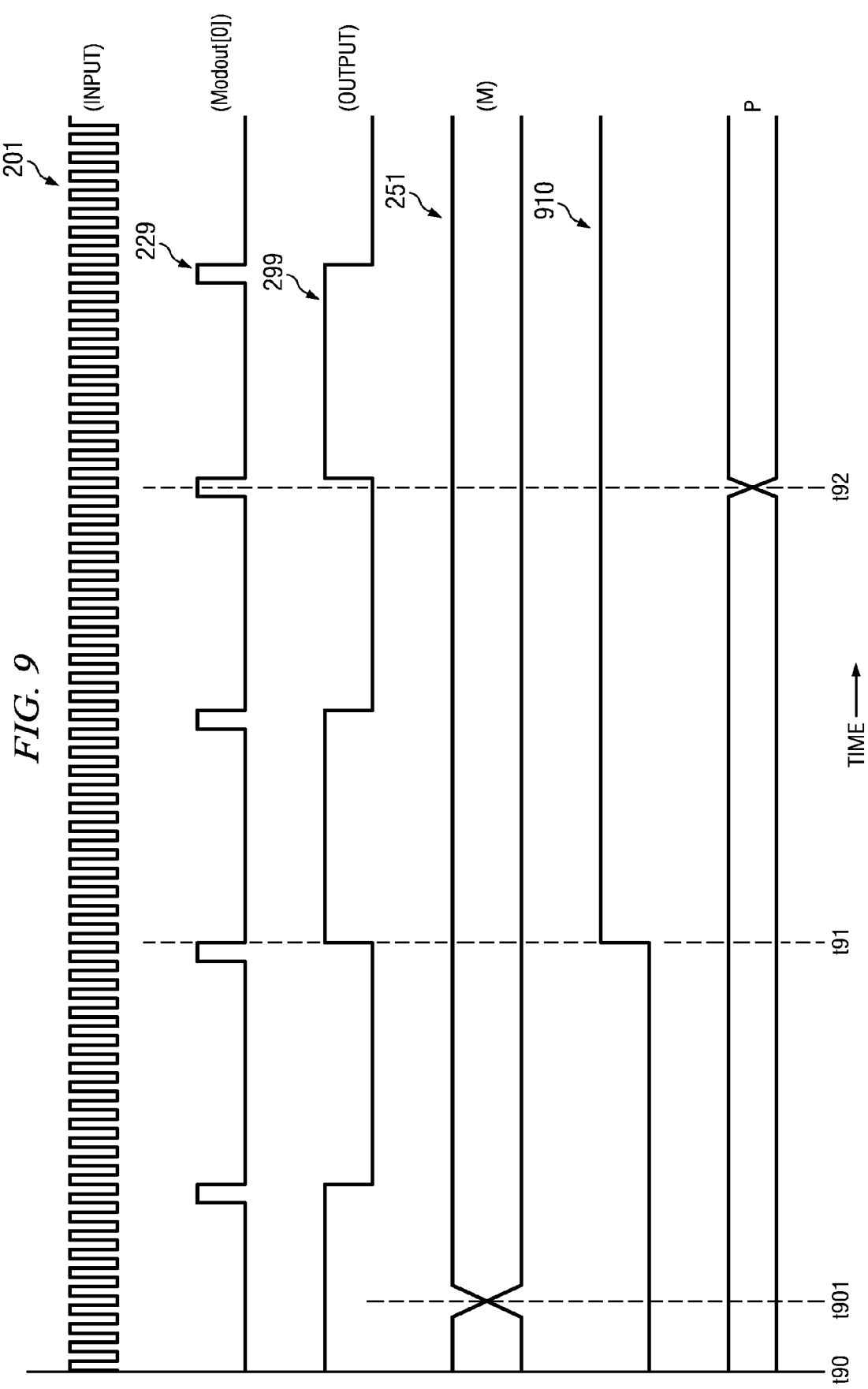
FIG. 9 is a diagram illustrating the manner in which control inputs are provided to corresponding stages of a frequency divider, when a division factor to be used is changed dynamically.

The 'immediately previous T/D mode' refers to the T/D mode corresponding to the value of M immediately prior to the change in M (i.e., immediately prior to the new value of M). When the additional condition noted above is satisfied (i.e., evaluates TRUE), the align condition is met, and program block 260 provides the generated program inputs on corresponding paths 242, 243, and 234-1 through 234-N at the immediately next rising edge of signal 229. FIG. 9 illustrates an example scenario in which control inputs are provided by program block 260 consistent with the 'align condition' requirements noted above.

In FIG. 9, the value of M (path 251) is assumed to be changed at time instance t901. It is also assumed that the T/D mode was set to Delay mode corresponding to the value of M immediately prior to the change in M at t901. Signal 910 is a signal that toggles whenever the value of M changes, and is shown transitioning from logic low to logic high at t91, indicating that a new value (or a valid value if M is received the first time after power-ON or initialization) of M has been received by program block 260. In response, program block 260 decodes the value of M to generate corresponding program inputs at or near t91. However, since the 'align condition' noted above is not satisfied at or near t91, program block 260 does not provide the generated program inputs till the align condition is satisfied at t92. The align condition is satisfied at t92, with both 299(OUTPUT) being a logic zero and the immediately previous value of T/D mode (assumed) set to Delay mode. Hence, program block 260 provides the new values of the program inputs on respective ones of paths 243, and 234-1 through 234-N at t92 synchronous with the rising edge of signal 229 (Modout[0]). The time instance (e.g., t92) at which the align conditions are satisfied may be referred to as an align time instance.

Signal 910 may be provided by a component external to frequency divider 200, aligned to the falling edge of signal 229, or be synchronized and aligned internally (by program block 260) to the falling edge of signal 229. Signal 910 in FIG. 9 represents such a synchronized and aligned signal.

Although not shown in any of the Figures, frequency divider 200 (FIG. 2) may receive an externally generated 'global reset' signal. The global reset signal may be used to disable operation of frequency divider 200 by maintaining all flip-flops in frequency divider 200 in a reset state.

As an example, the reset state of flip-flops in frequency divider 200 as well as bits of control settings register 1020, corresponding to application of a division factor M equaling four immediately on exiting from global reset, are provided below. The reset values are designed to ensure that Modout[0] (229) toggles on exit from global reset, thereby enabling program block 260 to store the M value immediately after release from reset. The reset values of corresponding bits of control settings register are as noted below:

i) Bits in control settings register 1020:
a) T/D=1 (Toggle mode).
b) EN-MOD-EXTEND=0.
c) Stage en[0]=0; MODIN-EN[k]=0, for all k.
d) P[0]=0; P[1]=1; P[k]=0 for all k higher than 1.
   ii) Output of FF6 (stage 210) is reset to 0.
   iii) Outputs of each of FF3, FF4 and FF5 (stage 220) are reset to 0.
   iv) Output of FF1 of each of the higher significance stages is set to 1. Output of FF2 of each of the higher significance stages is reset to 0.

In an embodiment, the flip-flops and the bits (noted above) are in their respective reset states (also as noted above) only when global reset is active (e.g., at logic one). However, in another embodiment, the flip-flops of stage 210, stage 220, and the storage bit locations of control settings register 1020 may be reset only when global reset is active, while the flip-flops of stages 230-1 through 230-N may be reset when either the global reset signal or an additional reset control signal is active. Such an additional reset control signal may be generated for each of stages 230-1 through 230-N based on whether the corresponding stage is required to be in operation or not. For example, the additional reset control signal for a stage 300[k] may be the same as the inverse if MODIN-EN [k−1]. For each of stages 230-1 through 230-N, a logical OR combination of the global reset signal and the inverse of MODIN-EN[k−1] (Modin-en[0] for stage 230-1) of a previous stage may also be used as the reset control signal.

Figure 10:
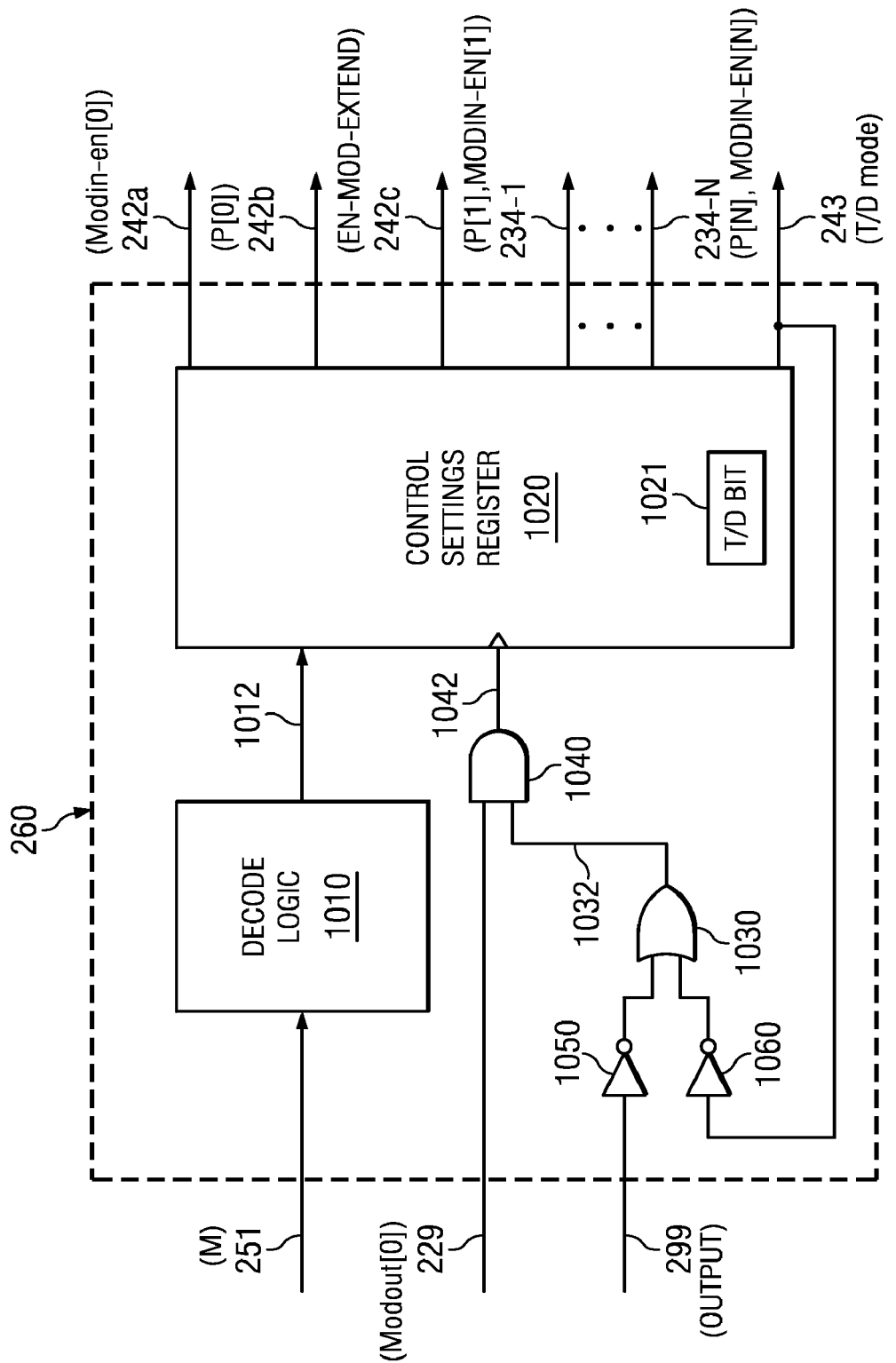
FIG. 10 is a diagram of a program block used in a frequency divider, in an embodiment.

FIG. 10 shows the implementation of program block 260 in an embodiment. Program block 260 of FIG. 10 is shown containing decode logic 1010, control settings register 1020, OR gate 1030, AND gate 1040, and inverters 1050 and 1060.

Decode logic 1010 receives division factor M on path 251(M) and generates on path 1012 the corresponding program inputs that need to be provided to stages 210, 220, and 230-1 through 230-N. The outputs on path 1012 are not directly (or immediately) provided to stages 210, 220 and 230-1 through 230-N. Instead outputs 1012 are provided as inputs to control settings register 1020.

Control settings register 1020 stores the outputs on path 1012 at a time instance when the align condition (described above) is met. Storage of outputs 1012 in control settings register makes the outputs immediately available as inputs (P inputs, stage-enable inputs, T/D mode signal, and EN-MOD-EXTEND) to the respective ones of stages 210, 220 and 230-1 through 230-N. The T/D bit specifying the T/D mode is shown stored in storage location 1021.

Thus, when the value of M is to be changed dynamically, control settings register 1020 continues to provide the 'current' values of the program inputs to the respective stages. Decode logic 1010 decodes the value of a 'new' M to form the "next" (new) settings of control settings register 1020, which are stored (and provided as the program inputs) by control settings register 1020 (only) at a time instance when the align condition is met.

Inverter 1050 receives signal 299 (OUTPUT), and provides the logical inverse of signal 299 as an input to OR gate 1030. Inverter 1060 receives the "previous" value of the T/D mode bit stored in location 1021, and provides the logical inverse of the T/D mode bit as another input to OR gate 1030. OR gate 1030 provides the result of a logical OR combination of the outputs of inverters 1050 and 1060 as input 1032 to AND gate 1040. Modout[0] (299) is provided as another input to AND gate 1040. AND gate 1040 provides the result of a logical AND combination of the inputs received as signal 1042 (align signal) to a clock terminal of control settings register 1020. Signal 1042 operates as a clock input to control settings register 1020. AND gate 1040 operates to generate a rising edge on path 1042 when signal 1032 is sensed as a logic high. On such a rising edge of signal 1042, 'new' settings (corresponding to a new value of M) for control settings register 1020 are loaded into control settings register 1020. Signal 1032 being high on the rising edge of signal 229 (Modout[0]) ensures that signals internal and external to program block 260 do not exhibit glitches when M changes.

In other embodiments, Modout[0] (229) may be provided to program block 260 only when a change in M is anticipated. Prior to and after a change in M (and the corresponding new settings in control settings register 1020), signal 229 may be gated-OFF from program block 260, i.e., provision of signal 229 to program block 260 may be disabled. Such gating/disabling enables reduction of power consumption in frequency divider 260 when M is not changing. Combinational logic may be used to sense a change in the bits of M, and generate a signal to enable provision of signal 229 to program block 260. A comparison of inputs (1012) and outputs (242, 243, 234-1-234-N) of control settings register 1020 may be used to determine when provision of signal 229 to program block 260 is to be disabled.

Frequency divider 200 implemented as described above may provide several benefits. The benefits may include low jitter on output signal 299, high-speed operation and lower power consumption, glitch-free dynamic change in division factor M, 50% duty cycle of output 299 for even values of M, and near-50% duty cycle for odd values of M, and ability to accommodate a wide range of division factors. PLL 100 (of FIG. 1) implemented using frequency divider 200 in place of one or more of dividers 110, 160 and 170 may also have similar benefits.

In the illustrations of FIGS. 1, 2, 3, 5 and 7, although terminals/nodes are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A frequency divider comprising:
a least significant (LS) stage coupled to receive a first input signal, a first program bit and a first input mode signal, and to generate a first frequency-divided signal and a first output mode signal, wherein the first input mode signal and the first program bit specify a division mode to be used by the LS stage;
a plurality of higher significance (HS) divider stages coupled in cascade, wherein each of the plurality of HS divider stages divides the frequency of an output of an immediately previous stage by a value specified by a corresponding program bit and a corresponding input mode signal, wherein the plurality of HS divider stages includes a first divider stage, wherein the first divider stage is coupled to receive the first frequency-divided signal and generates the first input mode signal; and
an output stage to receive the first output mode signal and a mode bit, and to generate a first output signal, wherein the output stage generates the first output signal by dividing a frequency of the first output mode signal by two if the mode bit is at one logic level, the output stage forwarding the output mode signal as the first output signal otherwise.

2. The frequency divider of claim 1, further comprising a program block to receive a division factor M and to compute the values of the first program bit, each of the corresponding program bits and the mode bit,
wherein the frequency of the first output signal is 1/M of the frequency of the first input signal, the program block to compute a value P, wherein P equals zero if the division factor M equals 2, wherein, if M is greater than 2, P equals M/2 if M is an even number, but equals (M−1)/2 if M is an odd number,
wherein the LS stage additionally receives a third bit, wherein the third bit has a same value as the least significant bit (LSB) of a binary representation of M if M is greater than four, the third bit being zero otherwise, wherein the division mode to be used by the LS stage is one of a divide-by-two mode, a divide-by-three mode and a divide-by-four mode,
wherein the LS stage operates to divide the frequency of the input signal by a factor equaling two, three, or four, based on the values of the LSB of M, the logic level of the first mode signal and the first program bit.

3. The frequency divider of claim 2, wherein each stage comprised in the plurality of HS divider stages operates to divide the frequency of the output of the corresponding immediately previous stage by a factor equaling two or three, based on the values of the logic level of the corresponding input mode signal and the corresponding program bit.

4. The frequency divider of claim 3, wherein the program block forwards the first program bit to the LS stage, each of the corresponding program bits to the corresponding stage in the plurality of stages and the mode bit to the output stage only at an align time instance even if the first program bit, each of the corresponding program bits and the mode bit are computed earlier than the align time instance, wherein the align time instance is a time instance at which a rising edge of the output mode signal occurs when the first output signal is at logic zero, or a time instance at which a rising edge of the output mode signal occurs and if the immediately previous value of the mode bit specified that the output stage is to operate in a delay mode.

5. The frequency divider of claim 4, further comprising a plurality of inverters including a first inverter, wherein a logic level of the first frequency-divided signal is inverted by the first inverter prior to being provided as an input to the first divider stage, and wherein logic levels of outputs of corresponding stages in the plurality of the HS divider stages are inverted by a corresponding inverter in the plurality of inverters prior to being provided as an input to a following stage.

6. The frequency divider of claim 5, wherein each stage in the plurality of HS divider stages comprises:

a first flip-flop, wherein a clock terminal of the first flip flop is coupled to receive the first input signal as a clock signal;

a first OR gate to receive a corresponding input mode signal and an inverse of a stage-enable signal as inputs and to generate a first OR output;

a first AND gate to receive the first OR output and an output of the first flip-flop as inputs and to generate a first AND output as a corresponding output mode signal;

a second flip-flop, wherein a clock terminal of the second flip-flop is coupled to receive the first input signal as a clock signal, wherein an input terminal of the second flip flop is coupled to receive the first AND output;

a second AND gate to receive an output of the second flip-flop and a corresponding program bit as inputs, and to generate a second AND output; and a first NOR gate to receive the second AND output and an output of the first flip-flop as inputs, and to generate a first NOR output, wherein the first NOR output is coupled to an input terminal of the first flip-flop, wherein the output of the first flip-flop represents a corresponding frequency-divided signal.

7. The frequency divider of claim 5, wherein the LS stage comprises:

a third flip-flop, wherein a clock terminal of the third flip flop is coupled to receive the first input signal as a clock signal;

a second OR gate to receive the first input mode signal and an inverse of a first stage-enable signal as inputs and to generate a second OR output;

a third AND gate to receive the second OR output and an output of the third flip-flop as inputs and to generate a third AND output as the first output mode signal;

a third OR gate to receive the third AND output and a third OR input as inputs and to generate a third OR output;

a fourth flip-flop, wherein a clock terminal of the second flip-flop is coupled to receive the first input signal as a clock signal, wherein an input terminal of the fourth flip flop is coupled to receive the third OR output;

a fourth AND gate to receive an output of the fourth flip-flop and the first program bit as inputs, and to generate a fourth AND output;

a fifth AND gate to receive the first output mode signal, the third bit and the first output signal as inputs, and to generate a fifth AND output;

a fifth flip-flop, wherein a clock terminal of the fifth flip-flop is coupled to receive the first input signal as a clock signal, wherein an input terminal of the fifth flip flop is coupled to receive the fifth AND output, wherein an output of the fifth flip-flop is the third OR input;

a fourth OR gate to receive the output of the fourth flip-flop and the output of the fifth flip-flop, and to generate a fourth OR output; and a second NOR gate to receive the fourth AND output and the fourth OR output, and to generate a second NOR output, wherein the second NOR output is coupled to an input terminal of the third flip-flop, wherein the output of the third flip-flop is the first frequency-divided signal.

8. The frequency divider of claim 5, wherein the output stage comprises:

a first multiplexer (MUX) to receive the first output mode signal as a first select signal and to provide a first MUX output;

a second MUX to receive the first MUX output and the first output mode signal as inputs, and to provide one of the first MUX output and the first output mode signal as a second MUX output based on the value of the mode bit; and a sixth flip-flop, wherein a clock terminal of the sixth flip-flop is coupled to receive the first input signal as a clock signal, wherein an input terminal of the sixth flip flop is coupled to receive the second MUX output, wherein an output of the sixth flip-flop and an inverse of the output of the sixth flip-flop are provided as inputs to the first MUX, wherein the first MUX provides one of the output of the sixth flip-flop and the inverse of the output of the sixth flip-flop as a first MUX output based on the value of the first select signal, wherein the output of the sixth flip-flop is the first output signal.

9. The frequency divider of claim 5, wherein the program block comprises:

a decode logic block to receive the division factor M and to generate the values of the first program bit, each of the corresponding program bits, the mode bit and the third bit as decoded outputs;

a control settings register to store the decoded outputs at a rising edge of an align signal, the control settings register to provide the stored decoded outputs as the corresponding ones of first program bit, each of the corresponding program bits, the mode bit and the third bit;

a fifth OR gate to receive a logical inverse of the first output signal and a logical inverse of the mode bit, and to generate a fifth OR output; and a sixth AND gate to receive the fifth OR output and the first output mode signal as inputs, and to generate the align signal as an output.

10. A frequency divider comprising:

a plurality of stages coupled in cascade, the plurality of stages including a least significant (LS) stage and a highest significance (HS) stage; and an output stage, wherein an input terminal of the LS stage is coupled to receive an input clock, the LS stage to divide the frequency of the input clock to generate a first output clock on a first output terminal, wherein an input terminal of the HS stage is coupled to the first output terminal, the HS stage to generate a second output clock, wherein a frequency of the second output clock is 1/P of a frequency of the input clock, the HS terminal to generate a highest output mode signal on a second output terminal, wherein another input terminal of the LS stage is coupled to the second output terminal, the LS stage to generate a first output mode signal, wherein a frequency of the first output mode signal equals a frequency of the second output clock, wherein the output stage is coupled to receive the first output mode signal and to generate an output clock, the frequency of the output clock being either half the frequency of the first output mode signal, or equal to the frequency of the output mode signal.

* * * * *